US005543337A

United States Patent [19]
Yeh et al.

[11] Patent Number: 5,543,337
[45] Date of Patent: Aug. 6, 1996

[54] METHOD FOR FABRICATING FIELD EFFECT TRANSISTOR STRUCTURE USING SYMMETRICAL HIGH TILT ANGLE PUNCHTHROUGH IMPLANTS

[75] Inventors: Stanley Yeh, Fremont; Sungki O, Milpitas; Partha Sundararajan, Newark, all of Calif.

[73] Assignee: LSI Logic Corporation, Milpitas, Calif.

[21] Appl. No.: 260,079

[22] Filed: Jun. 15, 1994

[51] Int. Cl.$^6$ .................................................. H01L 21/265
[52] U.S. Cl. .................................................. 437/35; 437/44
[58] Field of Search .................................. 437/35, 41, 44, 437/29, 36, 27, 150, 153, 45

[56] References Cited

U.S. PATENT DOCUMENTS

| | | | |
|---|---|---|---|
| 4,771,012 | 9/1988 | Yubu et al. | 437/35 |
| 5,147,811 | 9/1992 | Sakagami | 437/35 |
| 5,155,369 | 10/1992 | Current. | |
| 5,158,903 | 10/1992 | Hori et al. | |
| 5,270,226 | 12/1993 | Hori et al. | 437/35 |
| 5,270,227 | 12/1993 | Kameyama et al. | 437/35 |
| 5,320,974 | 6/1994 | Hori et al. | 437/35 |
| 5,362,982 | 11/1994 | Hirase et al. | 437/35 |
| 5,372,957 | 12/1994 | Liang et al. | 437/35 |
| 5,409,848 | 4/1995 | Han et al. | 437/35 |

FOREIGN PATENT DOCUMENTS

| | | | |
|---|---|---|---|
| 53-102668 | 9/1978 | Japan. | |
| 3-262130 | 11/1991 | Japan | 437/35 |
| 4113634 | 4/1992 | Japan | 437/35 |
| 5129217 | 5/1993 | Japan | 437/35 |

Primary Examiner—George Fourson
Assistant Examiner—S. Mulpuri
Attorney, Agent, or Firm—Poms, Smith, Lande & Rose

[57] ABSTRACT

Four electric field containment regions are formed in a semiconductor substrate by implanting ions into the substrate along four axes that are angularly oriented about a normal to a surface of the substrate in four orthogonal directions respectively. The implant axes are further angularly tilted from the normal by a large angle on the order of 45° such that the axes intersect the normal at a point below the surface. A field effect transistor (FET) is formed in the substrate above the containment regions such that the FET is substantially centered about the normal and has a channel that is aligned with one of the four orthogonal directions. A source and drain are formed at opposite ends of the channel. The containment regions formed under the source and drain respectively are configured to contain electric fields extending therefrom and thereby suppress punchthrough. The four containment regions are implanted at angles that minimize channeling, and any channeling that does occur is symmetrical. A second FET having a channel extending perpendicular to the channel of the first FET can be formed in the substrate over four containment regions that are identical to those for the first FET, thereby enabling universal containment regions to be utilized for FETs of either orientation.

11 Claims, 4 Drawing Sheets

METHOD FOR FABRICATING FIELD EFFECT TRANSISTOR STRUCTURE USING SYMMETRICAL HIGH TILT ANGLE PUNCHTHROUGH IMPLANTS

BACKGROUND OF THE INVENTION

1. Field of the Invention

The present invention generally relates to metal-oxide-semiconductor field-effect transistors (MOSFETs), and more specifically to a method of fabricating a MOSFET or other semiconductor device including a structure for suppressing punchthrough using symmetrical high tilt angle implants.

2. Description of the Related Art

Advances in integrated circuit technology have made possible the fabrication of MOSFETs with channel lengths of less than one-half micrometer. In order to prevent punchthrough, in which the depletion regions of the source and drain merge together to form an uncontrollable continuous channel, the doping of the substrate in the channel region is conventionally made considerably higher than in MOSFETs with longer channels. However, this produces a steep doping concentration gradient across the source/substrate and drain/substrate metallurgical junctions, which increases the electric fields across the junctions and creates undesirable effects including snapback and gate oxide charging.

FIG. 1 illustrates a P-channel, enhancement mode MOSFET 10 which is provided with a conventional arrangement for suppressing punchthrough. The MOSFET 10 comprises a silicon substrate 12 which is lightly doped N-type. A source 14 and a drain 16 which are both heavily doped P-type are formed on opposite sides of a channel 18. Metal contacts (not shown) provide external connection to the source 14 and drain 16.

A gate oxide layer 20 is formed over the channel 18, and a conductive polysilicon layer 22 which constitutes a gate electrode is formed over the gate oxide layer 20. Further illustrated are oxide spacers 24 and 26 formed on the opposite sides of the polysilicon layer 22.

Regions 28 and 30 which are lightly doped P-type are formed between the source 14 and the channel 18, and between the drain 16 and the channel 18 respectively. The regions 28 and 30 provide a "lightly doped drain" structure in the form of a reduced dopant concentration gradient that reduces the electric field across the drain/substrate and source/substrate metallurgical junctions and thereby suppresses punchthrough and related effects.

The MOSFET 10 further, as disclosed in U.S. Pat. No. 5,147,811, entitled "METHOD OF MANUFACTURING SEMICONDUCTOR DEVICE BY CONTROLLING THE PROFILE OF THE DENSITY OF P-TYPE IMPURITIES IN THE SOURCE/DRAIN REGIONS", issued Sept. 15, 1992 to E. Sakagami et al, comprises lightly doped N-type pockets or electric field containment regions 32 and 34 formed under the source 14 and drain respectively.

The regions 32 and 34 extend around the ends of the source 14 and drain 16 respectively toward the surface of the channel 18, and partially absorb and thereby contain the electric fields that cause depletion regions to expand from the source 14 and drain 16 toward each other through the channel 18. This electric field and depletion region containment arrangement suppress punchthrough.

The regions 32 and 34 are formed as disclosed in the above referenced patent to Sakagami by ion implantation at an angle that is tilted from a normal to the surface of the substrate 12. The tilt angle is made small, on the order of 8°, in order to minimize "channeling". Generally, if ion implantation is performed at an angle that is parallel to a crystallographic axis of the substrate 12, the ions will penetrate more deeply than desired or "channel" into the substrate 12. The channeling effect tends to increase as the tilt angle is increased.

Although effective, the punchthrough suppression arrangement including the regions 32 and 34 is disadvantageous in a large scale integrated circuit in which MOSFETs are arranged such that the channels of some of the MOSFETs extend perpendicular to the channels of others. For this reason, the punchthrough implants for the two different MOSFET orientations are conventionally performed separately.

More specifically, the implants for the MOSFETs of one orientation are performed from two opposite angles, and those for the MOSFETs of the other orientation are performed from two opposite angles that are perpendicular to the first two opposite angles. Although producing the required result, the operation is extremely time consuming since the substrate must be selectively rotated by 90° for implanting each MOSFET.

The patent to Sakagami teaches how to perform punchthrough implants in one continuous operation by rotating the substrate during implantation. This produces a continuous implant region having a generally cup shape under each MOSFET. The implant region is not, however symmetrical since the channeling effect varies with the crystallographic orientation of the substrate. This asymmetry has a substantial and undesirable effect on the electrical properties of the MOSFETs.

Another expedient is to form a punchthrough implant in the form of a flat, continuous layer under each MOSFET. This method, however, suffers from difficulty in controlling the electrical properties of the MOSFETs that result from the implant, and undesirably increasing the threshold voltages of the MOSFETs.

SUMMARY OF THE INVENTION

It is an object of the invention to provide a method of fabricating a MOSFET or other type of semiconductor device which includes effective punchthrough implants that are symmetrical and do not adversely affect the electrical properties of the MOSFET.

A MOSFET fabricated in accordance with the present method comprises four electric field containment regions that are formed in a semiconductor substrate by implanting ions into the substrate along four axes that are angularly oriented about a normal to a surface of the substrate in four orthogonal directions respectively. The implant axes are further angularly tilted from the normal by a large angle on the order of 45° such that the axes intersect the normal at a point below the surface.

A field effect transistor (FET), preferably a MOSFET, is formed in the substrate above the containment regions such that the FET is substantially centered about the normal and has a channel that is aligned with one of the four orthogonal directions. A source and drain are formed at the opposite ends of the channel.

The containment regions formed under the source and drain respectively are configured to contain electric fields extending therefrom and suppress punchthrough. The four containment regions are implanted at angles that minimize channeling, and any channeling that does occur is symmetrical.

It is another object of the invention to provide a method of fabricating a MOSFET or other type of semiconductor device comprising a universal electric field containment region structure for suppressing punchthrough which can be utilized for MOSFETs having either of two orthogonal channel orientations.

This enables a second FET having a channel extending perpendicular to the channel of a first FET to be formed in a substrate over four containment regions that are identical to those for the first FET. The containment regions for the first and second FETs are formed using an integral process, with no regard being given to the orientation of the FET that is to be formed over each specific containment region.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 2:
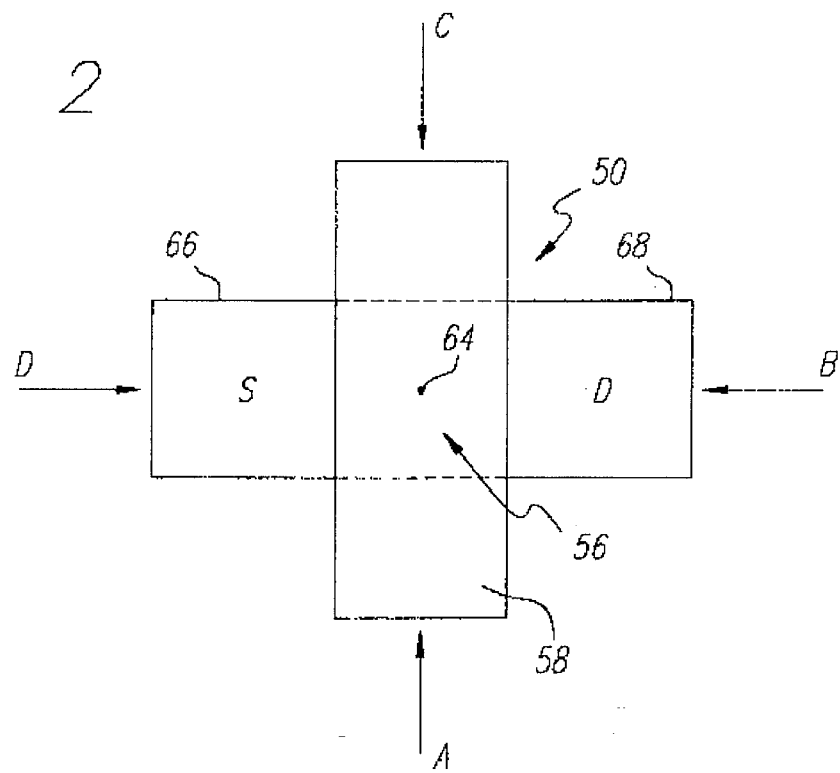
FIG. 2 is a simplified plan view illustrating a step in a fabrication method embodying the present method.
Figure 3:
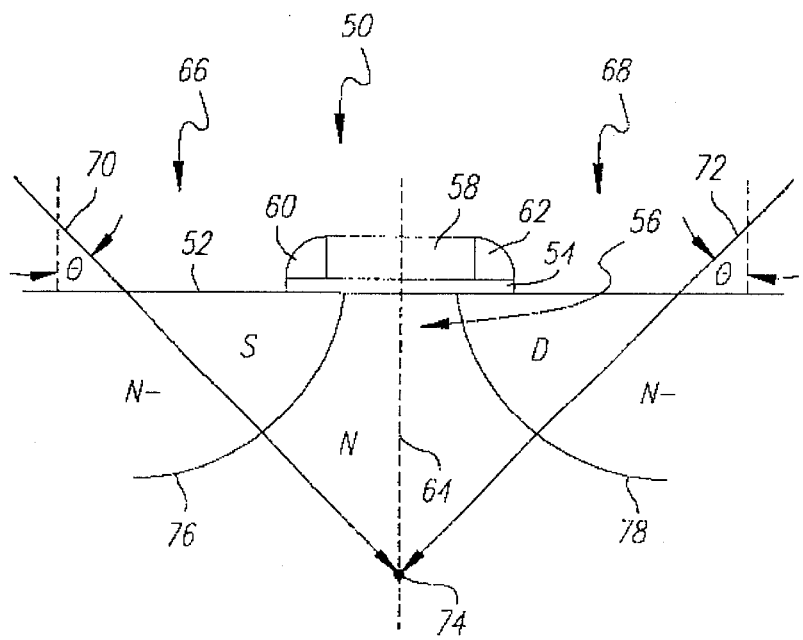
FIG. 3 is a simplified side elevation illustrating the step of FIG. 2.

As illustrated in FIGS. 2 and 3, a first step of fabricating a semiconductor device, preferably a P-channel, enhancement mode MOSFET, comprises forming a gate structure 50 on a silicon substrate 52 that is lightly doped N-type. The gate structure 50 comprises a gate oxide layer 54 which overlies a channel 56, a polysilicon gate layer 58, and oxide sidewall spacers 60 and 62.

The gate structure 50, as well as the finished MOSFET as will be described below, is substantially centered about a normal 64 to the surface of the substrate 52. The substrate 52 is then subjected to ion implantation from directions A, B, C and D that are orthogonal to each other about the normal 64, and are angularly displaced from the normal 64 by an angle θ.

The structure as illustrated in FIGS. 2 and 3 has a source region 66 and a drain region 68 that are spaced on opposite sides of the channel 56. The direction of current flow (minority carrier holes) is from the source region 66 through the channel 56 to the drain region 68, or in the direction D. The implants in the directions D and B are designated in FIG. 3 by the reference numerals 70 and 72 respectively. The implants from the directions A and C, although not visible in FIGS. 2 and 3, are identical to the implants 70 and 72 except rotated therefrom by 90°.

The four implants are all tilted by the same angle θ from the normal 64, and substantially intersect the normal 64 at a point 74 below the surface of the substrate 52. One of the directions A, B, C or D is selected to coincide with the 23° twist direction relative to the crystallographic structure of the silicon substrate 52. This will minimize channeling, even at high tilt angles on the order of 45°. The implant direction for other substrate materials will differ from 23°, but be selected using the same criteria in order to minimize channeling.

Figure 7:
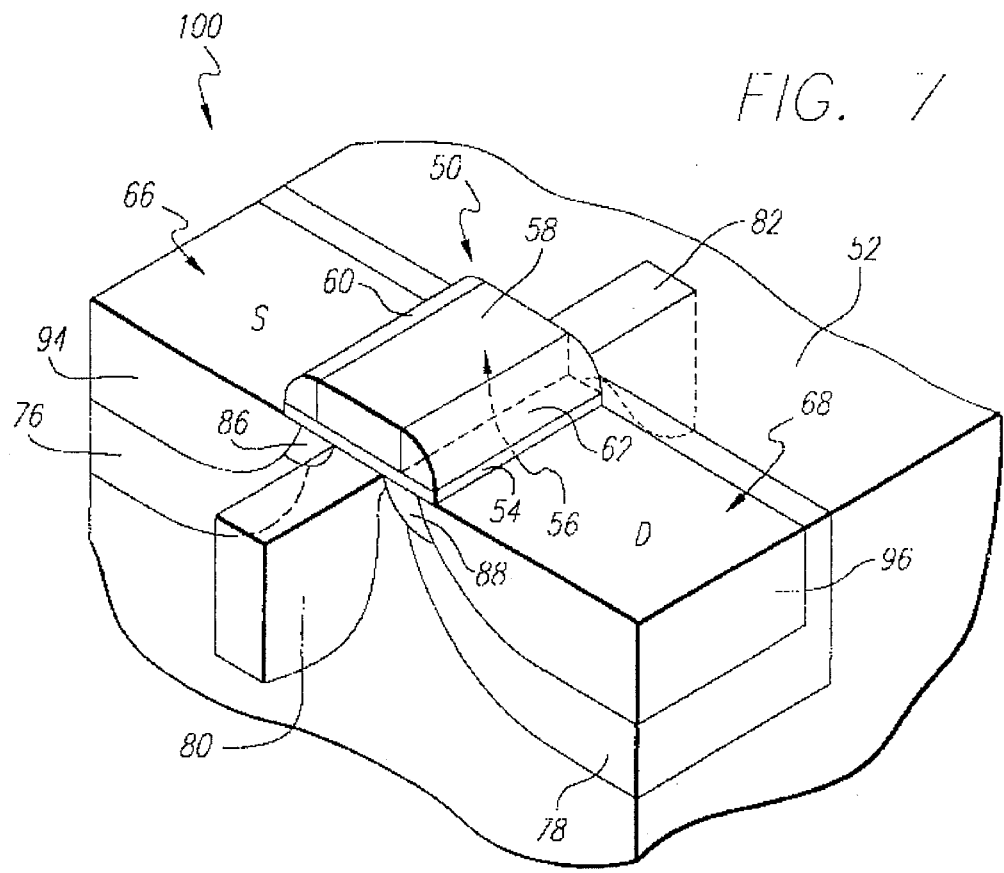
FIG. 7 is a perspective view, partially cut away, illustrating a MOSFET structure fabricated in accordance with the present method.

The implantation step of FIGS. 2 and 3 is performed using an N-type dopant, preferably phosphorous, although other N-type dopants such as arsenic can be used. In this manner, electric field containment regions 76, 78, 80 and 82 are formed in the substrate 52 which are symmetrical about the normal 64. The regions 76 and 78 are formed in the source and drain regions 66 and 68 respectively, whereas the regions 80 and 82, which are visible in FIG. 7, are formed on the opposite sides of the channel 56.

In a preferred embodiment of the invention, the tilt angle θ is approximately 45°. A large tilt angle is desirable in order to cause the implants to extend under the edges of the channel 56. The ion species is phosphorous, the implant energy is 120 KeV and the ion dose is $5 \times 10^{12}$ ions/cm$^{\prime 2}$.

However, the invention is not so limited, and can be advantageously practiced using a tilt angle θ that varies from approximately 30° to 60°, an implant energy that varies from approximately 80 KeV to 160 KeV, and an ion dose that varies from approximately $5 \times 10^{11}$ to $5 \times 10^{13}$.

Figure 4:
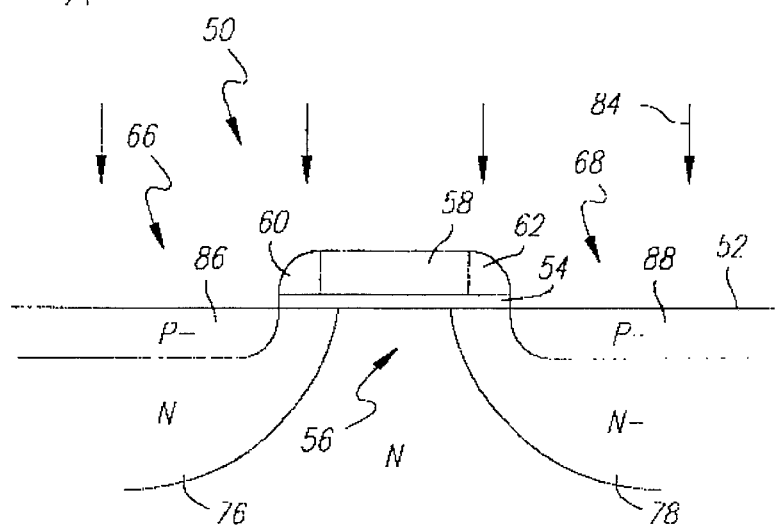
Figure 5:
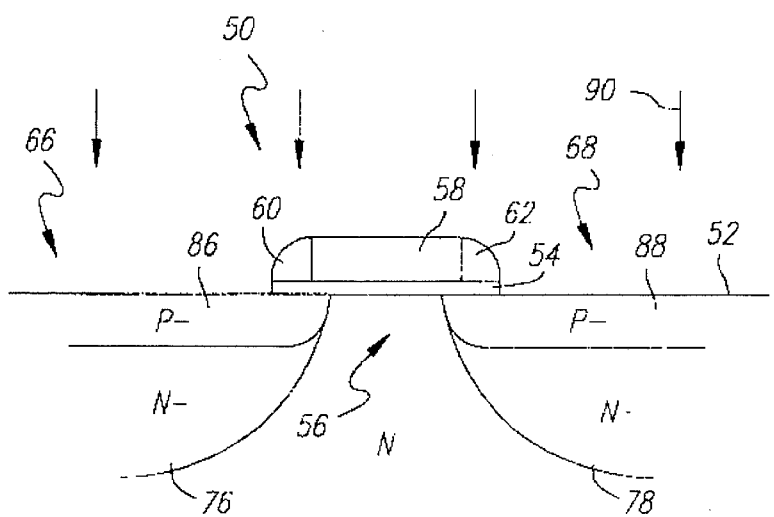

As illustrated in FIG. 4, another implant is performed as indicated by arrows 84 using a P-type dopant to form lightly doped regions 86 and 88 in the source and drain regions 66 and 68 respectively. The lightly doped regions 86 and 88 are thermally annealed as indicated by arrows 90 in FIG. 5 to drive them into the source and drain regions 66 and 68 and partially under the gate oxide layer 54.

Figure 1:
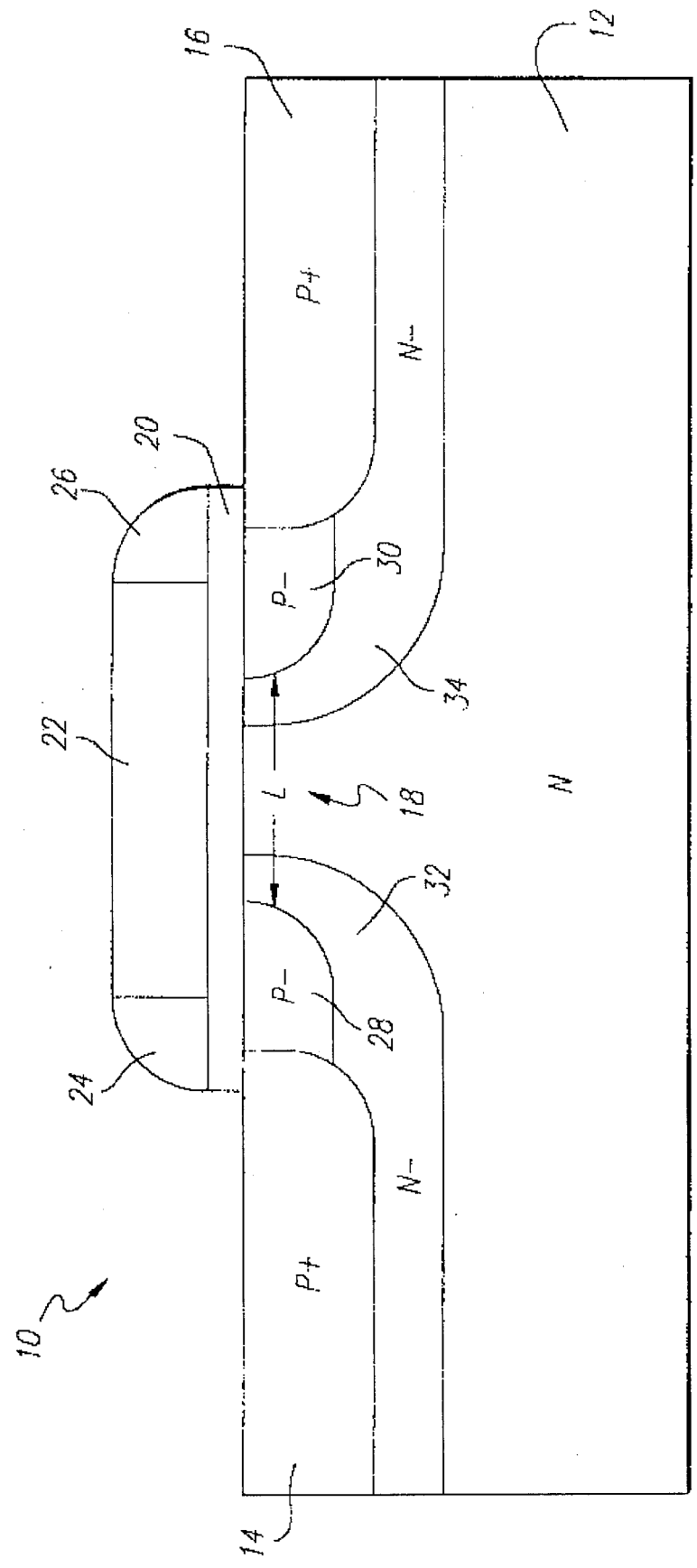
FIG. 1 is a simplified sectional view illustrating a prior art P-channel enhancement mode MOSFET including punchthrough implants.
Figure 6:
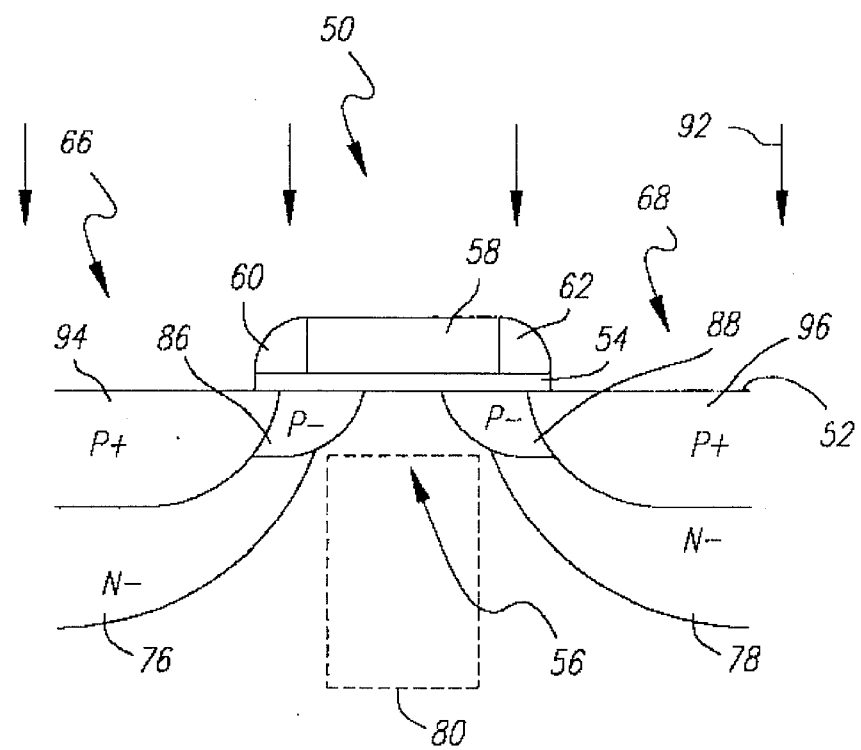
FIGS. 4, 5 and 6 are simplified sectional views illustrating further steps of the present method.

As illustrated in FIG. 6, a further implant using a P-type dopant is made to form a heavily doped source and drain 94 and 96 respectively that are externally connected by ohmic contacts (not shown). The source 94 and lightly doped region 86 constitute a lightly doped source structure, whereas the drain 96 and lightly doped region 88 constitute a lightly doped drain structure as described above with reference to FIG. 1. It will be understood that these lightly doped structures are optional, and that a MOSFET fabricated using the present method does not require the lightly doped regions 86 and 88 for operability.

FIG. 7 illustrates a MOSFET 100 embodying the present invention as fabricated using the method described above. The containment regions 76 and 78 partially absorb electric fields emanating from the source 94 and drain 96, and contain the electric fields and thereby the depletion regions that extend from the source 94 and drain 96 toward each other through the channel 56. This suppresses the punchthrough tendency of the MOSFET 10.

Figure 8:
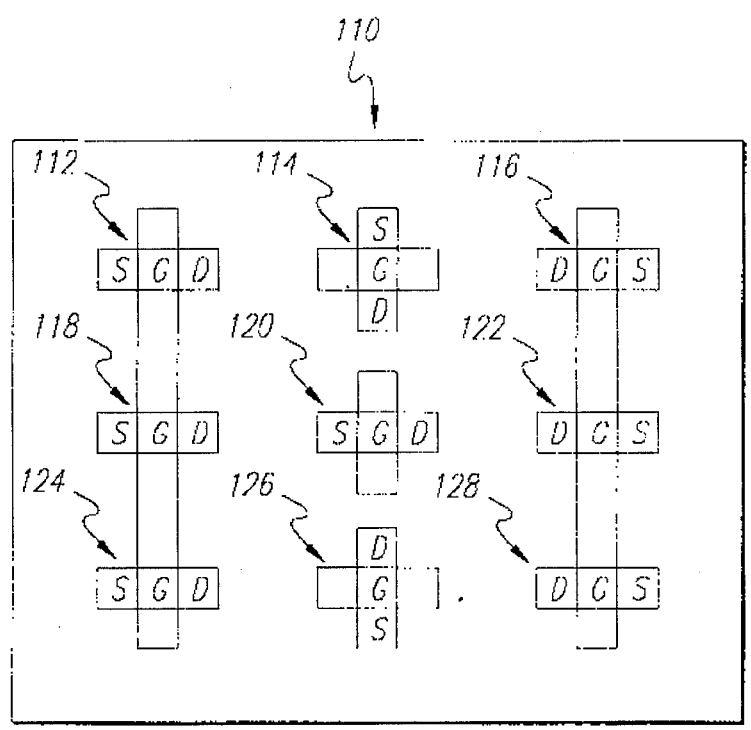
FIG. 8 is a simplified plan view illustrating an integrated circuit comprising a plurality of MOSFETs which are fabricated in accordance with the present method and have channels oriented in two orthogonal directions.

FIG. 8 illustrates an integrated circuit 110 fabricated according to the method of the invention as described above, comprising a plurality of semiconductor devices, preferably MOSFETs 112, 114, 116, 118, 120, 122, 124, 126 and 128. Each of the MOSFETs is formed with four orthogonal electric field containment regions as described above, although not visible in the drawing.

The MOSFETs 112, 116, 118, 120, 122, 124 and 128 have their channels, and thereby their current flow directions extending horizontally, whereas the channels and current flow directions of the MOSFETs 114 and 126 extend vertically as viewed in the drawing. The directions in which the containment regions of the MOSFETs extend are horizontal and vertical. Thus, each MOSFET, regardless of channel orientation, will have two containment regions disposed under its source and drain respectively.

The method and structure as described above with reference to the drawings achieves the objects of the present invention. More specifically, the invention provides a method of fabricating a MOSFET or other type of semiconductor device which includes effective punchthrough implants that are symmetrical and do not adversely affect the electrical properties of the MOSFET. The device comprises four containment regions which are implanted at angles that minimize channeling, and any channeling that does occur is symmetrical.

The present invention further achieves the object of fabricating a MOSFET or other type of semiconductor device comprising a universal electric field containment region structure for suppressing punchthrough, which can be utilized for MOSFETs having either of two orthogonal channel orientations.

While an illustrative embodiment of the invention has been shown and described, numerous variations and alternate embodiments will occur to those skilled in the art, without departing from the spirit and scope of the invention. Accordingly, it is intended that the present invention not be limited solely to the specifically described illustrative embodiment. Various modifications are contemplated and can be made without departing from the spirit and scope of the invention as defined by the appended claims.

We claim:

1. A method of fabricating a semiconductor device structure, comprising the steps of:
   (a) forming four electric field containment regions in a semiconductor substrate which comprises silicon by implanting phosphorous ions into the substrate at an energy of approximately 120 Kev and to a dose of approximately $5 \times 10^{12}$ ions/cm$^2$ along four axes that are angularly oriented about a normal to a surface of the substrate in four orthogonal directions respectively, and are angularly displaced from said normal by an angle of approximately 45° such that said axes substantially intersect said normal at a point below said surface; and
   (b) forming a semiconductor device in the substrate substantially entirely above said containment regions such that the device is substantially centered about said normal and has a current flow direction that coincides with one of said four orthogonal directions;
      in which one of said four orthogonal directions is substantially a 23° twist angle direction relative to a crystallographic orientation of the substrate.

2. A method as in claim 1, in which step (b) comprises fabricating said semiconductor device as including a field effect transistor (FET) having a channel that extends in said current flow direction.

3. A method of fabricating a semiconductor device structure, comprising the steps of:
   (a) forming four electric field containment regions in a semiconductor substrate which comprises silicon by implanting phosphorous ions into the substrate at an energy of approximately 120 Kev and to a dose of approximately $5 \times 10^{12}$ ions/cm$^2$ along four axes that are angularly oriented about a normal to a surface of the substrate in four orthogonal directions respectively, and are angularly displaced from said normal by an angle of approximately 45° such that said axes substantially intersect said normal at a point below said surface; and
   (b) forming a semiconductor device in the substrate above said containment regions such that the device is substantially centered about said normal and has a current flow direction that coincides with one of said four orthogonal directions;
      in which step (b) comprises fabricating said semiconductor device as including a field effect transistor (FET) having a channel that extends in said current flow direction, and comprises the substeps of:
   (c) prior to performing step (a), forming a gate on the substrate overlying said channel; and
   (d) subsequent to performing step (a), forming a source and a drain in the substrate that are spaced on opposite sides of said channel in said current flow direction and are disposed above two of said containment regions respectively;
      in which one of said four orthogonal directions is substantially a 23° twist angle direction relative to a crystallographic orientation of the substrate.

4. A method as in claim 3, in which step (a) comprises implanting said ions as including a species that suppresses punchthrough in the FET by containing electric fields extending from said source and said drain respectively.

5. A method as in claim 2, in which step (a) comprises implanting said ions to form said containment regions in a configuration that suppresses punchthrough in the FET by containing electric fields extending from said source and said drain respectively.

6. A method as in claim 2, in which step (b) comprises forming the FET as comprising at least one of a lightly doped source and a lightly doped drain.

7. A method of fabricating a semiconductor device structure, comprising the steps of:
   (a) forming four electric field containment regions in a semiconductor substrate which comprises silicon by implantating phosphorous ions into the substrate at an energy of approximately 120 Kev and to a concentration of approximately $5 \times 10^{12}$ ions/cm$^2$ along four axes that are angularly oriented about a normal to a surface of the substrate in four orthogonal directions respectively, and are angularly displaced from said normal by an angle of approximately 45° such that said axes substantially intersect said normal at a point below said surface; and
   (b) forming a semiconductor device in the substrate above said containment regions such that the device is substantially centered about said normal and has a current flow direction that coincides with one of said four orthogonal directions;
      in which one of said four orthogonal directions is substantially a 23° twist angle direction relative to a crystallographic orientation of the substrate.

8. A method as in claim 3, in which step (c) further comprises forming sidewall spacers on opposite sides of said gate.

9. A method of fabricating a semiconductor device structure, comprising the steps of:
   (a) forming four electric field containment regions in a semiconductor substrate which comprises silicon by implanting ions into the substrate along four axes that are angularly oriented about a normal to a surface of the substrate in four orthogonal directions respectively, and are angularly displaced from said normal by an angle such that said axes substantially intersect said normal at a point below said surface; and (b) forming a semiconductor device in the substrate above said containment regions such that the device is substantially centered about said normal and has a current flow direction that coincides with one of said four orthogonal directions;

in which one of said four orthogonal directions is substantially a 23° twist angle direction relative to a crystallographic orientation of the substrate.

10. A method of fabricating a semiconductor device structure, comprising the steps of:

(a) forming four electric field containment regions in a semiconductor substrate which comprises silicon by implanting ions into the substrate along four axes that are angularly oriented about a normal to a surface of the substrate in four orthogonal directions respectively, and are angularly displaced from said normal by a predetermined angle such that said axes substantially intersect said normal at a point below said surface; and (b) forming a semiconductor device in the substrate above said containment regions such that the device is substantially centered about said normal and has a current flow direction that coincides with one of said four orthogonal directions;

in which step (b) comprises fabricating said semiconductor device as including a field effect transistor (FET) having a channel that extends in said current flow direction, and comprises the substeps of:

(c) prior to performing step (a), forming a gate on the substrate overlying said channel; and (d) subsequent to performing step (a), forming a source and a drain in the substrate that are spaced on opposite sides of said channel in said current flow direction and are disposed above two of said containment regions respectively;

in which one of said four orthogonal directions is substantially a 23° twist angle direction relative to a crystallographic orientation of the substrate.

11. A method as in claim 10, in which step (c) further comprises forming sidewall spacers on opposite sides of said gate.

* * * * *